United States Patent [19]

Yerman

[11] Patent Number: 4,824,716
[45] Date of Patent: Apr. 25, 1989

[54] IMPERMEABLE ENCAPSULATION SYSTEM FOR INTEGRATED CIRCUITS

[75] Inventor: Alexander J. Yerman, Scotia, N.Y.

[73] Assignee: General Electric Company, Schenectady, N.Y.

[21] Appl. No.: 138,001

[22] Filed: Dec. 28, 1987

[51] Int. Cl.[4] .................. B32B 3/00; B32B 9/00; B23P 15/00
[52] U.S. Cl. .................. 428/209; 428/220; 428/335; 428/539.5; 428/689; 428/901; 428/473.5; 428/458; 428/336; 428/216; 428/450; 174/52.2; 361/400; 156/628; 156/644; 427/96
[58] Field of Search .................. 174/52 PE; 361/400; 428/195, 209, 689, 539.5, 901, 220, 335, 473.5, 458, 450, 336, 216, 704; 357/72, 73; 156/659.1, 628, 643, 644, 646, 656; 427/96, 99

[56] References Cited

U.S. PATENT DOCUMENTS

| 3,772,079 | 11/1973 | Louzon | 174/52 PE |
| 4,001,870 | 1/1977 | Saiki et al. | 357/54 |
| 4,163,072 | 7/1979 | Soos | 427/96 |
| 4,198,444 | 4/1980 | Yerman | 427/95 |

*Primary Examiner*—Ellis P. Robinson
*Assistant Examiner*—P. J. Ryan
*Attorney, Agent, or Firm*—Marvin Snyder; James C. Davis, Jr.

[57] ABSTRACT

An impermeable encapsulation system for integrated circuit chips utilizes a polyimide-siloxane block copolymer as an undercoat applied to the chip surface and an impermeable outer coat comprised either of a non-reactive metal, such as titanium, tantalum or aluminum, or an amorphous semiconductor material comprising silicon-boron. All of these materials may be effectively applied at temperatures sufficiently low to avoid damaging the chip.

17 Claims, 1 Drawing Sheet

IMPERMEABLE ENCAPSULATION SYSTEM FOR INTEGRATED CIRCUITS

The present invention relates to semiconductor packaging and more particularly to the protection of integrated circuit semiconductor devices from hostile environments.

BACKGROUND OF THE INVENTION

Considerable research is ongoing to identify packaging materials and encapsulation techniques for protecting integrated circuitry in an endless variety of applications ranging from outer space to implantations in the human body. Each unique application exposes the integrated circuitry to a different environment, which in most cases includes elements that are potentially harmful to integrated circuit chips. Many applications expose the integrated circuitry to trace chemicals which, in time, can permeate the chips to prejudice performance and operating life. Even the diffusion of ions into the chip semiconductor body has deleterious consequences. For example, when applied to implanted prostheses, integrated circuitry is exposed to extracellular fluid which approximates a 0.15 normal NaCl solution at 37° C. and is quite hostile to semiconductor chip structures.

In my U.S. Pat. No. 4,198,444, issued Apr. 15, 1980 and assigned to the instant assignee, the disclosure of which is specifically incorporated herein by reference, there is provided an encapsulation process for surface passivating and hermetically sealing large thyristors and other high voltage power semiconductor devices. As disclosed therein, a polyimide-siloxane block copolymer is applied to selected surface areas of the semiconductor device and cured to provide a tenaciously adherent passivation layer exhibiting good abrasion resistance and excellent dielectric properties. A layer of borosilicate or phosphosilicate glass is then applied by chemical vapor deposition over the copolymer layer as a primary hermetically sealing outer coating. To provide enhanced resistance to chemical attack and to further reduce moisture permeability, a secondary outer glass layer of silox or silicon dioxide is deposited as a top coat over the primary glass layer.

While this multiple layer encapsulation approach of my above-cited U.S. Pat. No. 4,198,444 is sufficiently protective for most power semiconductor device applications, I have found that the afforded degree of impermeability is insufficient for extended operating life of integrated circuitry exposed to certain particularly hostile environments, such as, for example, in the case of human implanted prostheses.

OBJECTS OF THE INVENTION

It is accordingly an object of the present invention to provide enhanced environmental protection for integrated circuitry.

A further object is to provide enhanced environmental protection for integrated circuit components by encapsulating the components with strongly adherent materials impermeable to hostile environmental elements.

An additional object is to provide a dual layer encapsulation system for integrated circuit semiconductor devices.

A still further object is to provide a method for processing semiconductor devices encapsulated in accordance with the present invention.

Other objects of the invention will in part be obvious and in part appear hereinafter.

SUMMARY OF THE INVENTION

In accordance with the present invention, an integrated circuit chip is undercoated with a layer of tenaciously adherent, dielectric material comprised of a polyimide-siloxane block copolymer and overcoated with a moisture and ion diffusion impervious layer selected from the group consisting of a non-reactive, anodizable metal, such as titanium, tantalum, and aluminum, and silicon-boron, an amorphous semiconductor material. The resulting two layer encapsulation system protects the IC chip while exposed to a wide variety of hostile environments.

The invention accordingly comprises the features of construction, combination of elements, and arrangement of parts, and the method steps for achieving same, all of which will be exemplified in the construction and method hereinafter set forth, and the scope of the invention will be indicated in the claims.

BRIEF DESCRIPTION OF THE DRAWINGS

For a fuller understanding of the nature and objects of the invention, reference should be made to the following detailed description taken in conjunction with the accompanying drawing, in which.

Like reference numerals refer to corresponding parts throughout the several views of the drawing.

DETAILED DESCRIPTION

Figure 1:
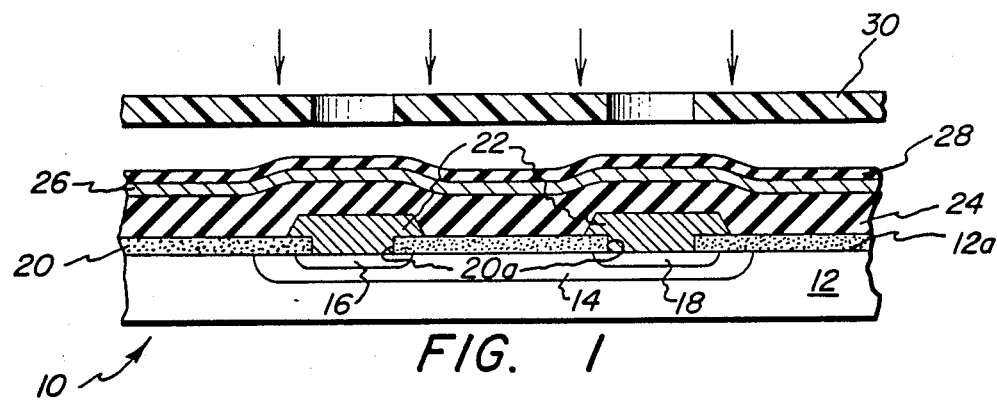
FIGS. 1 through 4 are fragmentary vertical sectional views depicting successive steps in the fabrication of an integrated circuit chip encapsulated in accordance with the present invention.

With reference to FIG. 1, there is shown an integrated circuit chip, generally indicated at 10, including a body 12 of suitable semiconductor material, such as silicon. Formed in this semiconductor body are plural active regions 14, 16 and 18 which are exposed at the upper surface 12a of the body. A thin insulative layer 20 of silicon dioxide or silicon nitride is formed over the body upper surface in conventional fashion. Windows 20a are opened in layer 20 to permit the deposition of metallization contact pads 22, typically of aluminum, in ohmic contact with active regions 16 and 18.

A layer 24 of a suitable polyimide-siloxane block copolymer, such as disclosed in my above-noted U.S. Pat. No, 4,198,444, as well as in Berger U.S. Pat. No. 4,051,163, issued Sept. 27, 1977 and Holub U.S. Pat. No. 3,325,450, issued June 13, 1967, all of which are assigned to the instant assignee, is applied to the exposed surfaces of the chip 10, including the insulative layer 20 and the contact pads 22. This material is dissolved in a suitable solvent, such as, for example, N-methylpyrrolidone, N,N-dimethylformamide or N,N-dimethylacetamide, and applied as a polymer precursor by conventional means such as dipping, spraying, spinning, brushing, etc. The block copolymers are then dried in an initial heating step at temperatures of about 75° to 125° C. for sufficient time to drive off the solvent, followed by heating at temperatures of about 150°–300° C. to effect the desired conversion to the polyimide-siloxane block structure and then a final cure.

A preferred curing cycle is as follows:
(a) for 15 to 30 minutes at from 135° C. to 150° C. in dry nitrogen, (b) for 15 to 60 minutes at from 175° to 190° C. in dry nitrogen, and (c) for 1 to 3 hours at about 225° in a vacuum.

Sufficient material is applied to the integrated chip surface to provide layer 24 having a thickness of from 5 microns to 2 mils, with 5 to 10 microns being a preferred range. The resulting layer is a tough, durable, highly insulative undercoat which, largely by virtue of its siloxane content, tenaciously adheres to the chip surface.

While the polyimide-siloxane material of my above-noted U.S. Pat. No. 4,198,444 is preferred for layer 24, alternative polyimide-siloxane block copolymer structures based on 4—4'bisphenol "A"-dianhydride and compounded with sufficient siloxane to achieve the requisite adhesion could be employed.

To complete the impermeable encapsulation system of the present invention, the polyimide-siloxane block copolymer layer 24 is topcoated with a highly impervious, layer 26 of a suitable non-reactive material, such as tantalum, titanium, aluminum or a silicon-boron composition. All of these materials can be applied at sufficiently low temperatures, i.e., less than 400° C., so as not to harm chip 10, particularly its aluminum contact pads 22 and layer 24, or jeopardize adhesion of layer 24 to the chip surface. Moreover, a top coat of any of these materials is significantly less permeable to moisture and ion diffusion than the glass outer layers of my above-cited U.S. Pat. No. 4,198,444 when applied under the same temperature constraints. Tantalum, titanium and aluminum may be applied using conventional low temperature sputter coating or vacuum deposition techniques, while an amorphous semiconductor material comprised of silicon-boron may be applied using well-known chemical vapor deposition procedures. For example, a silicon-boron outer layer 26 may be deposited out onto layer 24 by flowing a mixture of diborane and silane gases in a nitrogen carrier through a hot wall quartz tube furnace. For example, in a nitrogen gas flowing at the rate of 50 standard liters per minute, silane gas is introduced at a rate of 200 standard cubic centimeters per minute in mixture with diborane gas of a concentration 0.6% that of the silane gas to deposit a silicon-boron outer layer 26 of 6000 Angstroms thickness in 20 minutes at a deposition temperature of 320° C. Thicknesses of outer layer 26 may range from 5000 Angstroms to 2 microns; however, a thickness of less than 1 micron is preferred in order to avoid excessive stresses and cracking due to the expansion mismatch with the layer 24 material.

Figure 2:
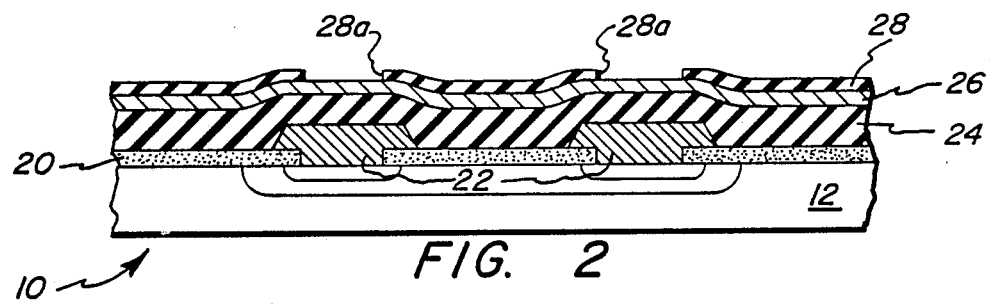
Figure 3:
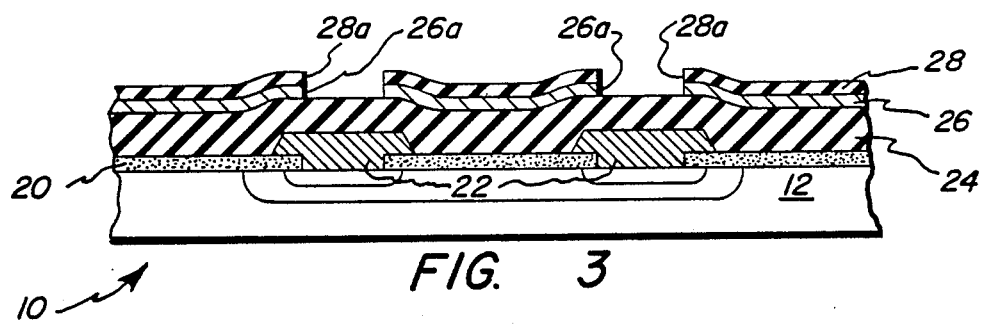
Figure 4:
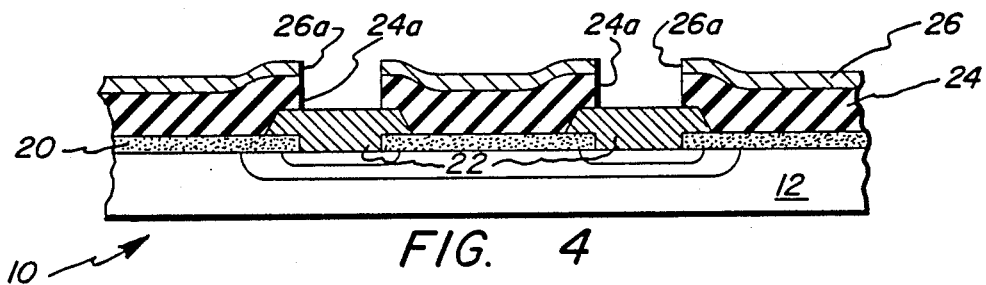

Having fully encapsulated integrated circuit chip 10, it then becomes necessary to provide access to the contact pads 24 for the connection thereto of external lead wires or metallization conductor runs (not shown). To this end, a layer 28 of positive photoresist is coated over outer layer 26 and is photolithographically patterned using a mask 30, as seen in FIG. 1. The photoresist layer is then selectively etched away in the patterned areas to create windows 28a therein in overlying registry with contact pads 22 (FIG. 2). Then, using the photoresist layer as a mask, the outer encapsulation layer 26 is etched away through windows 28a to create corresponding windows 26a therein (FIG. 3). In the case of a tantalum outer layer, these windows may be created using etchant solutions containing hydrofluoric acid or strong caustics, or by using a reactive ion etching process employing carbon tetrafluoride ($CF_4$) or alternatively by using oxygen mixed with polychlorinated organic materials such as carbon tetrachloride ($CCl_4$) or ethylene trichloride ($C_2HCl_3$). An outer layer of titanium or aluminum may be etched in the same manner by using higher concentrations of polychlorinated compounds in oxygen. In the case of a silicon-boron outer layer, windows 26a may be formed in a plasma reactor using a carbon tetrafluoride-oxygen mixture. Finally, windows 24a (FIG. 4) are created in the polyimide-siloxane primary or inner encapsulation layer 24 again using an oxygen plasma reactor with a more oxygen rich gas mixture. The photoresist layer 28 is removed in conventional manner, leaving the contact pads 22 exposed in windows 24a in layer 24 and windows 26a in overlying layer 26. It will be noted from FIG. 4 that these windows expose only the central portions of the contact pads, and thus there is a considerable bond interface between the contact material and the primary layer material to discourage moisture and ion penetration to the chip body 12. Moreover, since the thickness of primary layer 24 is preferably less than 1 micron, there is, in relation to the overall chip surface area, miniscule surface area of primary layer material exposed in windows 24a to such potentially harmful environmental elements. If desired, after the electrical connections to the contact pads 22 have been made, these contact areas may be varnish coated for enhanced protection. However, it will be appreciated that the aluminum contact pads are inherently impermeable. In the case where the outer layer 26 is metallic, i.e., either tantalum, titanium or aluminum, it is preferred that it be anodized to create a protective, insulative oxide coating on its outer surface. Moreover, although a metallic outer layer limits the voltage rating of the IC chip, it affords the added benefit of electrostatic shielding.

From the foregoing description it is seen that the objects set forth above, including those made apparent therein, are efficiently attained, and since certain changes may be made in the disclosed embodiment without departing from the scope of the invention, it is intended that all matters contained in the above description and shown in the accompanying drawing shall be interpreted as illustrative and not in a limiting sense.

What is claimed is:

1. An impermeable encapuslation system for an integrated circuit chip comprising:
   A. A layer of polyimide-siloxane block copolymer applied as an undercoat to a surface of the chip; and
   B. an impervious outer coat applied over said undercoat, said outer coat selected from the group of materials consisting of tantalum, titanium, aluminum and silicon-boronn and having a thickness in the range of 5000 Angstroms to 2 microns.

2. The encapsulation system defined in claim 1, wherein the thickness of said undercoat is in the range of 5 microns to 2 mils.

3. The encapsulation system defined in claim 1, wherein the thickness of said undercoat is in the range of 5 to 10 microns, and the thickness of said outer coat is less than 1 micron.

4. The encapsulation system defined in claim 1, wherein said outer coat comprises an anodized metal coating selected from the group consisting of tantalum, titanium and aluminum.

5. The encapsulation system defined in claim 4, wherein said anodized metal coating is less than 1 micron thick.

6. The encapsulation system defined in claim 3, wherein said outer coat comprises an anodized metal coating selected from the group consisting of tantalum, titanium and aluminum.

7. An impermeable encapsulation system for an integrated circuit chip having metallic contact pads thereon, comprising:
   A. a layer of a polyimide-siloxane block copolymer disposed over a surface of the chip so as to overlap and bond to the surfaces of the pads in a manner to leave a central region of said pads uncoated thereby; and
   B. an impervious outer coat disposed over said layer of a polyimide-siloxane block copolymer in a manner to leave said central region of said pads uncoated thereby, said outer coat selected from the group of materials consisting of tantalum, titanium, aluminum and silicon-boron and having a thickness in the range of 5000 Angstroms to 2 microns.

8. The encapsulation system defined in claim 7, wherein the thickness of said undercoat is in the range of 5 microns to 2 mils.

9. The encapsulation system defined in claim 7, wherein the thickness of said undercoat is in the range of 5 to 10 microns, and the thickness of said outer coat is less than 1 micron.

10. The encapsulation system defined in claim 7, wherein said outer coat comprises an anodized metal coating.

11. The encapsulation system defined in claim 10, wherein said anodized metal coating is less than 1 micron thick.

12. The encapsulation system defined in claim 9, wherein said outer coat comprises an anodized metal coating selected from the group consisting of tantalum, titanium and aluminum.

13. A method of encapsulating an integrated circuit chip having metallization contact pads on a surface thereof, said method comprising the steps of:
   A. applying a first layer of polyimide-siloxane copolymer in a thickness from about 5 to about 10 microns over the chip surface and the contact pads thereon;
   B. applying over said first layer at a temperature less than 400° C. an outer impermeable layer in a thickness of less than 1 micron comprising a material selected from the group consisting of tantalum, titanium, aluminum and silicon-boron;
   C. selectively removing portions of said outer layer to create first windows therein in overlying registry with the contact pads on the chip surface; and
   D. etching said first layer through said first windows to create corresponding second windows in said first layer to expose the contact pads on the chip surface for ultimate electrical connection to lead conductors.

14. The method defined in claim 13, wherein said first layer etching step is performed using an oxygen-carbon tetrafluoride mixture in a plasma reactor.

15. The method defined in claim 13 wherein the step of selectively removing portions of said outer layer to create first windows therein comprises etching said outer layer.

16. The method defined in claim 14, wherein said outer layer comprises one of the group consisting of tantalum, titanium and aluminum, said method further including the step of anodizing the exposed surface of said outer layer.

17. The method defined in claim 14, wherein said outer layer comprises silicon-boron applied over the chip surface and contact pads by chemical vapor deposition.

* * * * *